(12) United States Patent
You et al.

(10) Patent No.: US 10,082,692 B2
(45) Date of Patent: Sep. 25, 2018

(54) DISPLAY APPARATUS

(71) Applicant: Samsung Display Co., Ltd., Yongin-Si, Gyeonggi-Do (KR)

(72) Inventors: Kwangsun You, Cheonan-si (KR); Keunho Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/195,355

(22) Filed: Jun. 28, 2016

(65) Prior Publication Data

US 2017/0097536 A1 Apr. 6, 2017

(30) Foreign Application Priority Data

Oct. 2, 2015 (KR) ........................ 10-2015-0139210

(51) Int. Cl.
*F21V 8/00* (2006.01)
*G02F 1/1333* (2006.01)
*H05K 1/18* (2006.01)

(52) U.S. Cl.
CPC ..... *G02F 1/133308* (2013.01); *G02B 6/0055* (2013.01); *G02B 6/0088* (2013.01); *H05K 1/18* (2013.01); *G02F 2001/13332* (2013.01); *G02F 2001/133314* (2013.01); *G02F 2001/133325* (2013.01); *G02F 2201/46* (2013.01); *H05K 2201/10136* (2013.01)

(58) Field of Classification Search
CPC ... G02F 1/133308; G02F 2001/133314; G02F 2001/133332; G02F 2001/133325; G02F 2001/46; G02B 6/0055; G02B 6/0088; H05K 1/18; H05K 2201/10136
USPC ........................................................ 362/615
See application file for complete search history.

(56) References Cited

FOREIGN PATENT DOCUMENTS

| KR | 1020070076289 A | 7/2007 |
|---|---|---|
| KR | 1020080011519 A | 2/2008 |

*Primary Examiner* — Karl D Frech
(74) *Attorney, Agent, or Firm* — Cantor Colburn LLP (57) ABSTRACT

A display apparatus includes a display panel, a backlight unit, a bottom cover, a printed circuit board ("PCB") electrically connected to the display panel, a shield cover disposed on a lower surface of the PCB, and including a planar part on which a hook opening part is defined, and a bent part bent from the planar part to face the side wall part, and a top cover which is coupled to the bottom cover and includes a side surface part surrounding the side wall part, and a hook part extending from one end of the side surface part, inserted into the hook opening part, and coupled to the shield cover.

16 Claims, 12 Drawing Sheets

DISPLAY APPARATUS

This application claims priority to Korean Patent Application No. 10-2015-0139210, filed on Oct. 2, 2015, and all the benefits accruing therefrom under 35 U.S.C. § 119, the content of which in its entirety is herein incorporated by reference.

BACKGROUND

1. Field

Exemplary embodiments of the invention herein generally relate to a display apparatus, and more particularly, to a display apparatus having an improved coupling structure.

2. Description of the Related Art

A flat panel display apparatus such as a liquid crystal display apparatus and an organic electroluminescent display apparatus are used for displaying images on various information processing apparatuses, such as televisions, monitors, laptop computers, and mobile phones. Also, recently, a curved display apparatus applied from such a flat panel display apparatus has been developed. The curved display apparatus provides display areas having shapes of curved surfaces, and thus may provide users with images with enhanced three-dimensional effects, immersive effects, and presence effects.

SUMMARY

In a case of a curved display apparatus, there may be a limitation in that even a minute difference in curvatures of a display panel and accommodation members accommodating the display panel, etc. may cause a lifting phenomenon in coupling of different components having minute differences in curvatures.

The invention provides a display apparatus which may improve the assemblability of structural components provided to the display apparatus and have improved appearance quality characteristics. In particular, provided is a display apparatus which may improve the coupling property between components due to minute differences in curvatures and uniformly manage the thickness thereof.

An exemplary embodiment of the invention provides a display apparatus, including a display panel, a backlight unit providing light to the display panel, a bottom cover accommodating the display panel and the backlight unit, and including a bottom part and a side wall part bent in a direction substantially perpendicular to a plane in which the bottom part extends, a printed circuit board ("PCB") electrically connected to the display panel, and disposed on a lower surface of the bottom part, a shield cover disposed on a lower surface of the PCB, and including a planar part on which a hook opening part is defined, and a bent part bent from the planar part to face the side wall part, and a top cover which is coupled to the bottom cover and includes a side surface part surrounding the side wall part, and a hook part extending from an end of the side surface part, inserted into the hook opening part, and coupled to the shield cover.

In an exemplary embodiment, the display panel may have a curved surface, and each of the bottom cover, the top cover and the shield cover may have a shape curved along the curved surface.

In an exemplary embodiment, the hook part may have a shape curved along the curved surface.

In an exemplary embodiment, the hook opening part may be disposed adjacent to a border line between the planar part and the bent part.

In an exemplary embodiment, the hook part may include a first hook portion connected to the side wall part to pass through the hook opening part, and a second hook portion bent in an outward direction of the planar part from the first hook portion, where the first hook portion may have a curved surface.

In an exemplary embodiment, the hook part may further include a third hook portion bent from the second hook portion to face the bent part.

In an exemplary embodiment, a plurality of recess parts may be defined in the top cover, where the plurality of recess parts may be provided respectively from both sides of the hook part.

In an exemplary embodiment, the top cover may further include a front surface part bent from the other end facing the one end of the side surface part, and partially covering an upper surface of the display panel.

In an exemplary embodiment, the hook opening part may be defined in the planar part in plurality, the plurality of hook opening parts may be arranged in a direction of long sides of the display panel, the hook part may be provided in plurality, and the plurality of hook parts may be respectively disposed corresponding to the plurality of hook opening parts.

In an exemplary embodiment, the side surface part may face at least a portion of the bent part.

In an exemplary embodiment, the side surface part may include a first portion facing the bent part, and a second portion forming a step with respect to the first portion.

In an exemplary embodiment, a thickness of the second portion may be equal to or greater than a thickness of the first portion.

In an exemplary embodiment, a coupling opening part may be defined in the side surface part of the top cover.

In an exemplary embodiment, the shield cover may further include a coupling part bent from the bent part to face the planar part, where the coupling part may be inserted into the coupling opening part.

In an exemplary embodiment, the coupling opening part may be defined in the side surface part in plurality, the hook part may be provided in plurality, and the plurality of coupling opening parts and the plurality of hook parts may be alternately disposed along the direction of long sides of the display panel.

In an exemplary embodiment, screw holes may be defined in the planar part of the shield cover, and the shield cover may further include screws inserted into the screw holes, and fastening the shield cover and the bottom cover.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

The invention may be modified in several different forms, and specific embodiments will be exemplified in the drawings and described in detail. It is to be understood that the exemplary embodiment of invention is not limited to the disclosed embodiments, and is intended to cover various modifications and equivalent arrangements included within the spirit and scope of the invention, including the appended claims.

In the figures, the scales of some components are exaggerated or reduced for clearer illustration of layers and regions. Like reference numerals refer to like elements throughout. When a layer is referred to as formed (disposed) 'on' another layer or substrate, it can be directly on the other layer or substrate, or intervening layers may also be present. Also, although a surface of a layer is illustrated flat in the drawings, the surface would not necessarily required to be flat, but a step difference may be generated on the surface of an upper layer by the surface shape of a lower layer in a laminating process.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, a display apparatus according to an exemplary embodiment of the invention will be described with reference to the accompanying drawings.

Figure 1:
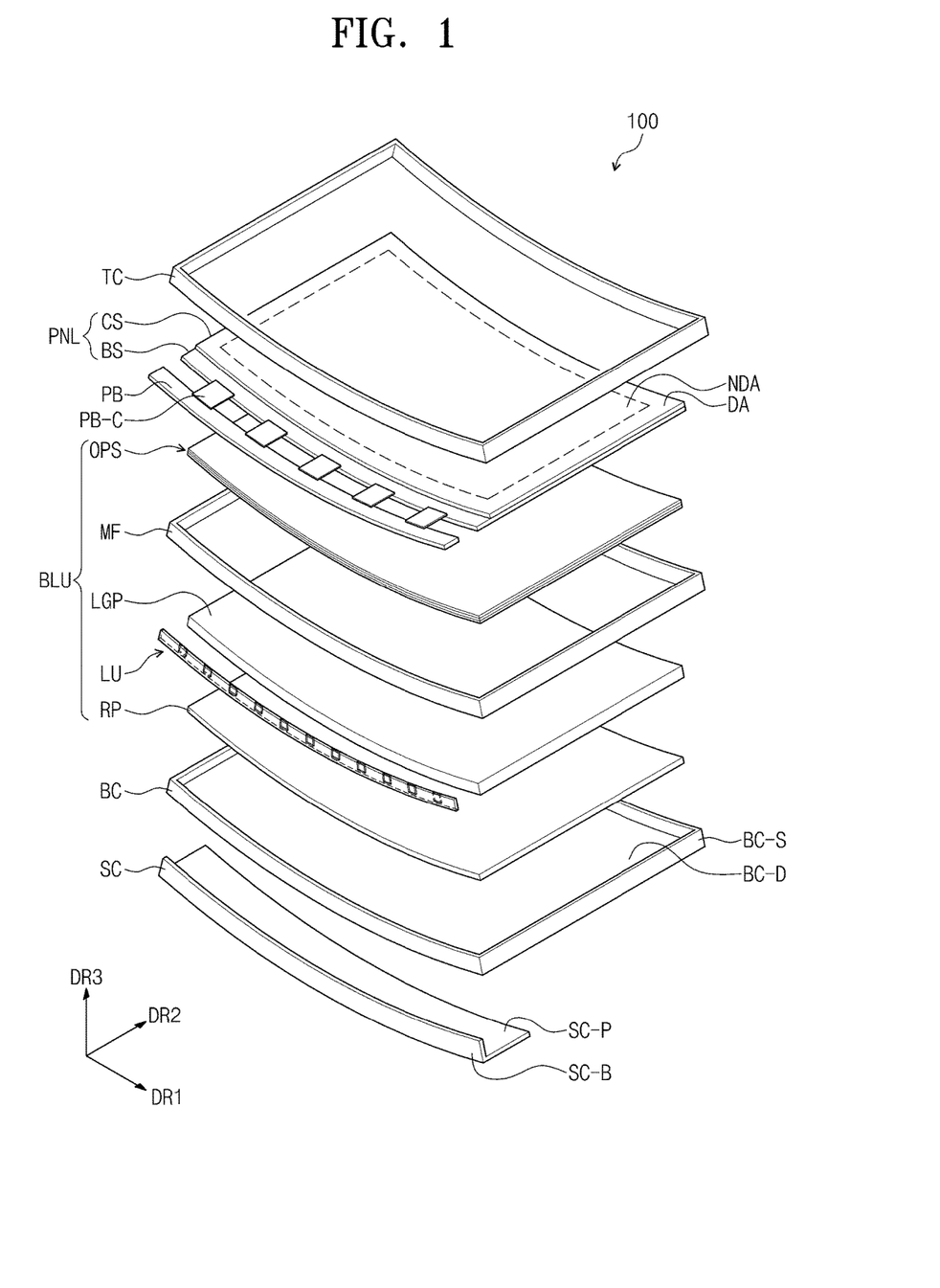
FIG. 1 is an exploded perspective view of an exemplary embodiment of a display apparatus according to the invention.

FIG. 1 is an exploded perspective view of a display apparatus according to an exemplary embodiment of the invention. A display apparatus 100 according to an exemplary embodiment may include a display panel PNL, a backlight unit BLU providing the display panel PNL with light, and a bottom cover BC accommodating the display panel PNL and the backlight unit. Also, the display apparatus 100 according to an exemplary embodiment illustrated in FIG. 1 may further include a top cover TC on the display panel PNL.

The display apparatus 100 according to an exemplary embodiment illustrated in FIG. 1 may include a display panel PNL having a curved surface. Also, the top cover TC and the bottom cover BC may have shapes curved along the curved surface of the display panel PNL. That is, a display apparatus according to an exemplary embodiment may be a curved display apparatus which includes a display panel having a curved surface, a top cover TC, and a bottom cover BC, but the shape of the display apparatus is not limited thereto. A display apparatus according to an exemplary embodiment may be a flat panel type display apparatus.

Hereinafter, for convenience of description, the direction in which an image is provided in the display apparatus 100 is referred to as an upper direction, and the direction opposite to the upper direction is referred to as a lower direction, but the upper and lower directions are relative concepts and may be changed into other directions.

The display apparatus 100 may have a curved shape which is concave in the upper direction, that is, convex in the lower direction. However, the exemplary embodiment of the invention is not limited thereto, and the display apparatus may have a curved shape which is convex in the upper direction.

The display panel PNL included in the display apparatus 100 according to an exemplary embodiment may be provided in the form of a rectangular plate shape having two pairs of sides parallel to each other, and any one pair of sides among the two pairs of sides may be provided longer than the other pair of sides. Referring to the illustration of FIG. 1, in a display apparatus according to an exemplary embodiment, the display panel PNL may be described in the form of a rectangular shape having a pair of long sides connected to a pair of short sides. Hereinafter, the extension direction of the long sides of the display panel PNL is defined as a first direction DR1, and the extension direction of the short sides is defined as a second direction DR2. Also, the thickness direction of the display panel is defined as a third direction DR3.

In an exemplary embodiment, the display panel PNL may have flexibility. In an exemplary embodiment, an initial shape of the display panel PNL may be flat or curved, and the initial shape may be deformed into other shapes in a final state of being assembled as the display apparatus 100, for example.

The display panel PNL may be curved in various ways. In an exemplary embodiment, the display panel PNL may be curved to be convex in the lower direction or in the upper direction, for example. However, the curved direction of the display panel PNL is not limited thereto.

Also, the display panel PNL may be provided in a curved shape at an initial stage, but may be provided to be rigid without flexibility. In an exemplary embodiment, the display panel PNL may be provided in a fixed shape curved to be convex in the lower direction or in the upper direction, for example.

In an exemplary embodiment illustrated in FIG. 1, the display panel PNL may have a shape curved along the first direction DR1. Accordingly, the long sides of the display panel PNL may have shapes curved in the first direction DR1, and the short sides of the display panel PNL may have straight line shapes in the second direction DR2 substantially perpendicular to the first direction DR1. However, the exemplary embodiment of the invention is not limited thereto, and the display panel may be a curved display panel curved in at least one direction of the first direction DR1 or the second direction DR2.

The display panel PNL may have a display area DA on which images are displayed and a non-display area NDA which is provided on at least one side of the display area DA and disposed outside the display area. Also, the display area DA of the display panel PNL may be shaped in a curved surface.

The display panel PNL included in the display apparatus 100 according to an exemplary embodiment may be a liquid crystal display ("LCD") panel, and the display panel PNL may display an image using the light emitted from the backlight unit BLU. However, kinds of display panel included in the display apparatus of an exemplary embodiment are not limited thereto, and the display panels PNL may be other kinds of display panels such as nano-crystal display panels, electrophoretic display panels, and electrowetting display panels.

In an exemplary embodiment of the invention, an LCD panel will be described as an example for convenience of description. The display panel PNL may include a base substrate BS, a counter substrate CS facing the base substrate BS, and a liquid crystal layer (not shown) provided between the base substrate BS and the counter substrate CS.

The base substrate BS of the display panel PNL may include a plurality of pixel electrodes (not shown) and a plurality of thin film transistors ("TFTs") (not shown) which are electrically connected to the plurality of pixel electrodes in an one-to-one correspondence. Each TFT switches a driving signal that is provided to the corresponding pixel electrode. Also, the counter substrate CS may include a common electrode (not shown) which forms an electric field controlling the arrangement of liquid crystals together with the pixel electrodes, and a color filter (not shown). The common electrode forms an electric field applied to the liquid crystal layer (not shown) together with the plurality of pixel electrodes, and the color filter filters the light emitted from the backlight unit BLU into color light.

However, in an exemplary embodiment, the base substrate BS and the counter substrate CS are not limited to the above-mentioned structure. In an exemplary embodiment, in another embodiment, the base substrate BS instead of the counter substrate CS may include the color filter and the common electrode.

The display apparatus 100 may include the backlight unit BLU under the display panel PNL. The backlight unit BLU may provide light to the display panel PNL. Specifically, the backlight unit BLU may include a light source part LU providing light to the display panel PNL and a light guide plate LGP guiding the light emitted from the light source part to the display panel PNL. The light source part LU may be disposed adjacent to one side of the light guide panel LGP.

Referring to the illustration in FIG. 1, in an exemplary embodiment, the backlight unit BLU may further include a reflection part RP and optical sheets OPS. Also, the backlight unit BLU of the display apparatus 100 may further include a mold frame MF which supports the display panel PNL and the optical sheets OPS. In an exemplary embodiment, the optical sheets OPS may include a prism sheet, a diffusion plate, etc., for example. Also, the light guide plate LGP may include one surface facing the display panel PNL and the other surface opposed to the one surface, and the display apparatus may further include a reflection part RP facing the other surface side of the light guiding panel. The reflection part RP may be disposed between the light guide plate LGP and a bottom part of the bottom cover BC. The reflection part RP may reflect the light incident thereto to guide the light toward the display panel and thus may increase light efficiency of the display apparatus.

The bottom cover BC in the display apparatus 100 may be disposed under the backlight unit BLU. The bottom cover BC may accommodate the display panel PNL and the backlight unit BLU mentioned above. In an exemplary embodiment, the bottom cover BC may include a metallic material including stainless steel ("SUS"), galvalume, or aluminum, or plastic, etc., for example.

The bottom cover BC may include a bottom part BC-D and a side wall part BC-S bent in a direction substantially perpendicular to the bottom part. The bottom part BC-D may face the light guide panel LGP, and the side wall part BC-S may be disposed surrounding the backlight unit BLU including the light guide plate and the display panel PNL.

In an exemplary embodiment, the bottom part BC-D of the bottom cover BC may have a rectangular shape in a plan view, for example. Also, the side wall part BC-S may be bent in a thickness direction of the display panel, which is a third direction DR3, from four sides of the bottom part BC-D. In another exemplary embodiment, a portion of the side wall part BC-S bent from the four sides of the bottom part BC-D may not be provided.

The display apparatus 100 includes a top cover TC coupled to the bottom cover BC. The top cover TC may be coupled to and disposed on the bottom cover BC. The top cover TC may be disposed surrounding the side wall part BC-S of the bottom cover BC which accommodates the display panel PNL and the backlight unit BLU. Also, the top cover TC may be disposed on the display panel PNL. In an exemplary embodiment, the top cover TC may have a rectangular shape in a plan view, for example.

The display apparatus 100 may include a printed circuit board ("PCB") PB electrically connected to the display panel PNL. In FIG. 1, although the PCB PB is connected to the display panel through a coupling member PB-C, the PCB PB may be disposed on a lower surface of the bottom part BC-D in a final assembled state.

The PCB PB may be configured as a multi-layered substrate in which an insulation layer and a circuit layer are repeated, and is provided with a driving circuit to provide electric signals to the display panel PNL. In an exemplary embodiment, the PCB PB may include a timing controller which receives image data inputted from the outside and control signals and outputs a gate control signal and a data control signal, for example. Also, the coupling member PB-C electrically connects the PCB PB to the display panel PNL and may be a flexible printed circuit ("FPC").

The display apparatus 100 may include a shield cover SC covering the PCB PB. The shield cover SC may be disposed on the lower surface of the bottom cover BC. The shield cover SC may include a planar part SC-P and a bent part SC-B bent from the planar part. The bent part SC-B may be bent in a thickness direction of the display panel which is the third direction DR3.

The shield cover SC may protect the PCB PB. The shield cover SC may be fixed to the top cover TC and the bottom cover BC.

Figure 2A:
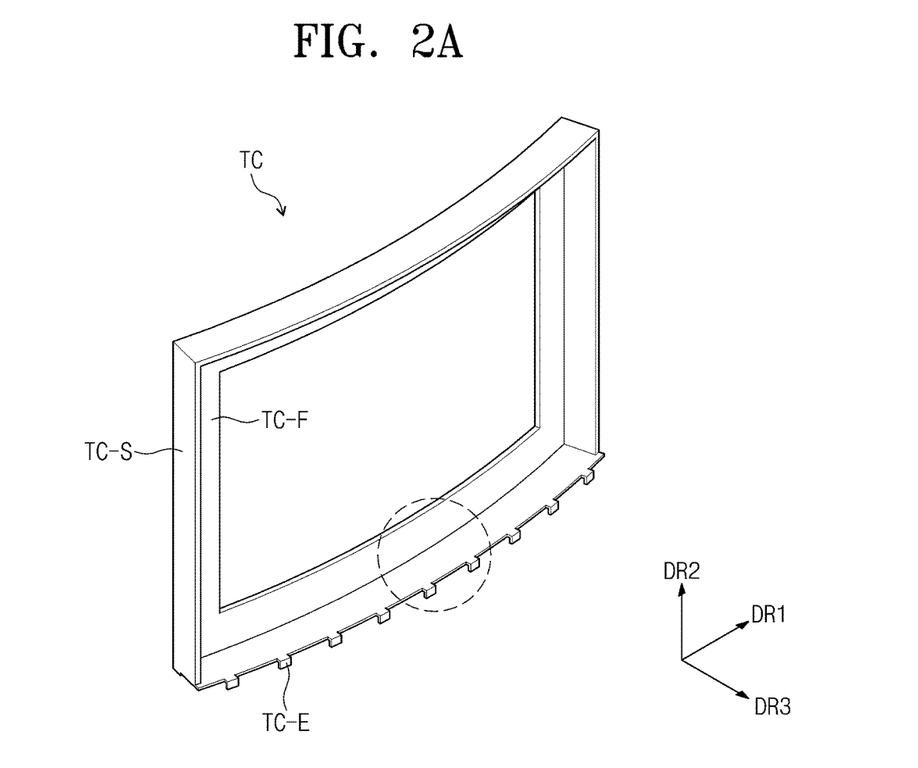
FIGS. 2A to 2B are perspective view of an exemplary embodiment of a top cover included in a display apparatus according to the invention.
Figure 2B:
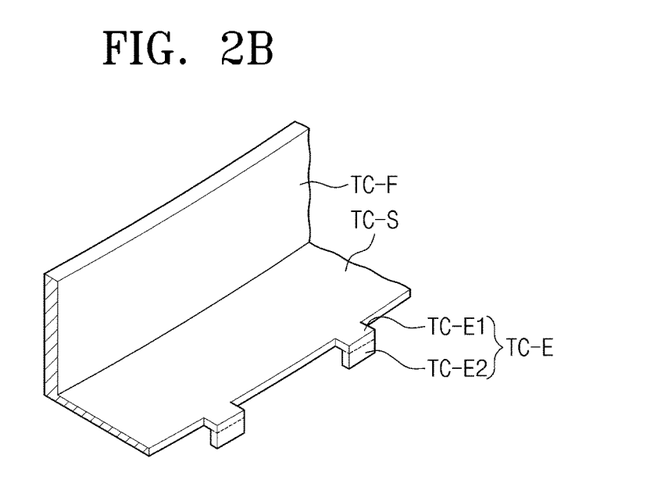
Figure 3:
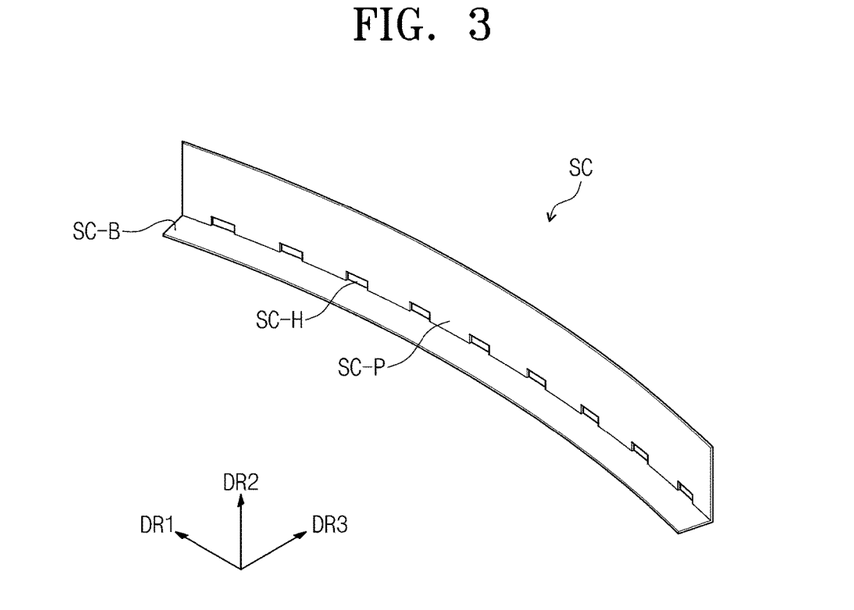
FIG. 3 is a perspective view of an exemplary embodiment of a shield cover included in a display apparatus according to the invention.
Figure 4A:
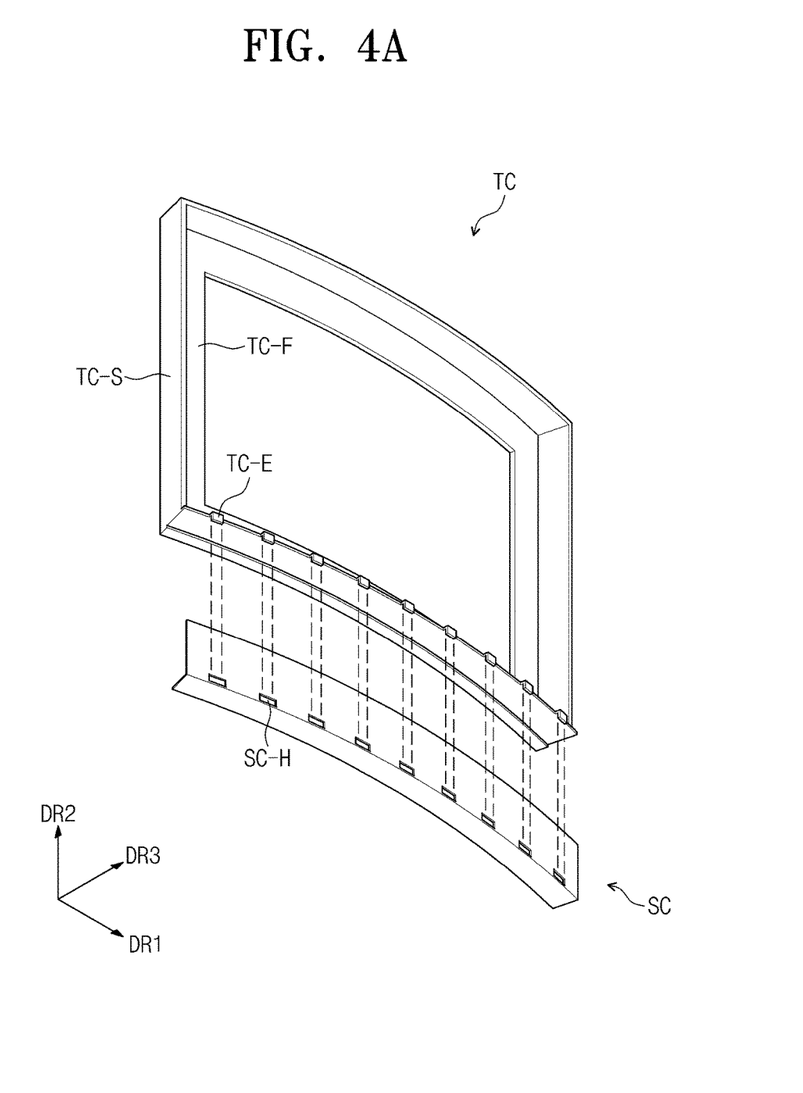
FIGS. 4A to 4C are views illustrating an exemplary embodiment of a coupling relation between a shield cover and a top cover included in a display apparatus according to the invention.
Figure 4B:
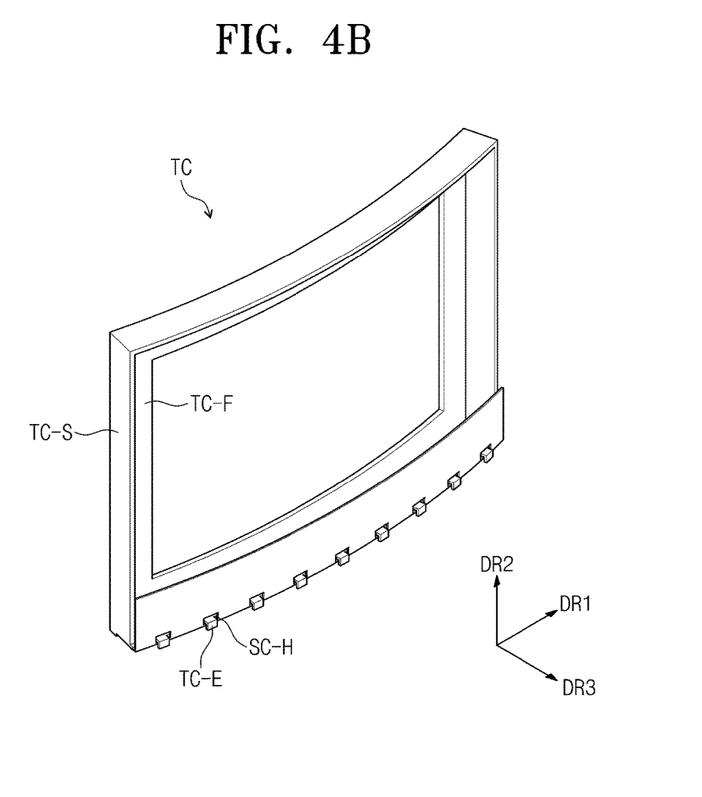
Figure 4C:
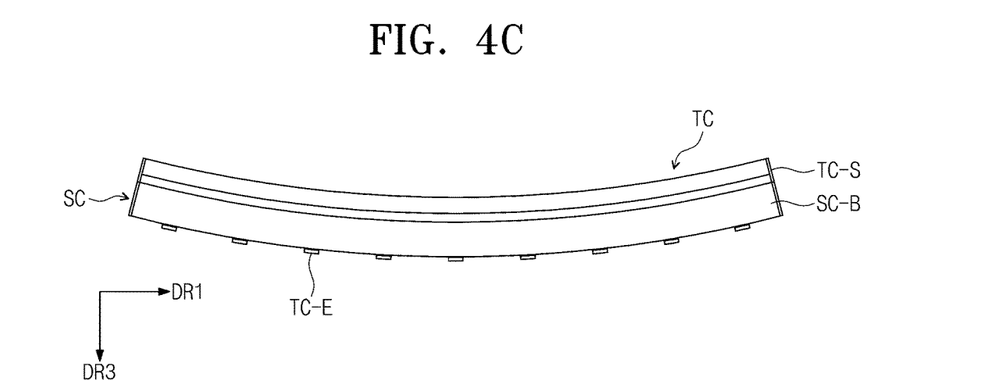

FIG. 2A is a partial perspective view of a top cover TC according to an exemplary embodiment. FIG. 2B is a partial enlarged view of a region indicated with a dotted line in FIG. 2A. That is, FIG. 2B may be an enlarged view of one side end portion of the top cover TC. Also, FIG. 3 is a perspective view of a shied cover according to an exemplary embodiment, and FIG. 4 is a perspective view illustrating the relation between a shield cover and a top cover.

Referring to FIGS. 2A to 2B, a top cover TC may include a side surface part TC-S and a hook part TC-E. The hook part TC-E may be formed by being bent from one side of the side surface part TC-S. In an exemplary embodiment, the hook part TC-E may be bent in a direction substantially perpendicular to the side surface part TC-S, for example. Specifically, the hook part TC-E may extend from an end of the lower side surface part from the side wall surface part TC-S which has a rectangular shape in a plan view. The hook part TC-E may extend from the side surface part TC-S, and may be bent in an outward direction of the planar part of the shield cover SC.

Although not shown in the drawing, the side surface part TC-S of the top cover may be disposed surrounding the side wall part BC-S of the bottom cover BS. Also, the hook part TC-E may be inserted into a hook opening part SC-H (refer to FIG. 3) defined in the shield cover SC. Accordingly, the top cover may be coupled to and disposed on the shield cover SC through the hook part formed at one end of the side surface part.

Also, in the illustration in FIGS. 2A to 2B, the top cover TC may further include a front surface part TC-F. The front surface part TC-F of the top cover may be bent from the other end which is different from the one end in which the hook part TC-E is provided with respect to the side surface part TC-S. The front surface part TC-F may partially cover an upper surface of the display panel PNL. In an exemplary embodiment, the surface part TC-F may be disposed surrounding outside regions of the display panel such that image displaying surface of the display panel is exposed.

In the following drawings and related descriptions, though a case in which the front surface part is included in the top cover as an example, the exemplary embodiment of the invention is not limited thereto, and in another embodiment, the front surface part may not be provided in a display apparatus.

The top cover TC may have a curved surface curved in the first direction DR1. The curved shape of the top cover TC may correspond to the curved shape of the display panel included in the display apparatus. Also, the hook part TC-E may have a shape curved in the first direction DR1 along the curved surface of the curved shape of the top cover TC.

The hook part TC-E disposed on the top cover may include a first hook portion TC-E1 which is connected to the side surface part TC-S of the top cover, and a second hook portion TC-E2 bent from the first hook portion TC-E1. The first hook portion TC-E1 may be a region passing through the hook opening part SC-H defined in the shield cover. Also, the second hook portion TC-E2 may extend from the first hook portion TC-E1, and may be bent in an outward direction of the planar part of the shield cover SC from the first hook portion.

FIG. 3 is a perspective view illustrating a shield cover SC included in an exemplary embodiment. The shield cover SC may include a planar part SC-P and a bent part SC-B. A hook opening part SC-H may be defined in the planar part SC-P of the shield cover. Also, the bent part SC-B bent from the planar part SC-P may face the side wall part BC-S of the bottom cover BC. Although not shown in the drawings, the shield cover SC may further include a side surface part (not shown). In an exemplary embodiment, the PCB may be surrounded by a space which is defined by the planar part and the side surface part of the shield cover.

The shield cover SC may be a cover member for protecting the PCB. The shield cover SC may include a material having flexibility, and may include a metallic material. In an exemplary embodiment, the shield cover SC may include stainless steel ("SUS") material.

In an exemplary embodiment, the shield cover SC may have a relatively small thickness in comparison with the bottom cover BC and the top cover TC, and may have, for example, a thickness of about 0.1 millimeter (mm) to about 5 mm. The shield cover SC may have a shape curved corresponding to the curvature of the display panel having the curved surface.

That is, the display apparatus according to an exemplary embodiment may include the display panel having the curved surface, the bottom cover BC, the top cover, and the shield cover which are provided with the curved surfaces corresponding to the curved surface of the display panel.

A hook opening part SC-H may be defined in the planar part SC-P of the shield cover SC. Also, a display apparatus may be provided with a plurality of hook opening parts SC-H which are arranged in the first direction DR-1 corresponding to the direction of the long sides of the display panel. The above-mentioned plurality of hook parts of the top cover may be respectively inserted into the plurality of hook opening parts SC-H to be fixed.

The hook opening part SC-H may be defined in the planar part SC-P of the shield cover SC, and may be disposed adjacent to a border between the planar part SC-P and the bent part SC-B of the shield cover SC. That is, the hook opening part SC-H may be defined in the planar part SC-P so as to be offset toward the bent part SC-B. Here, the case in which the hook opening part SC-H is disposed adjacent may include a case in which the hook opening part SC-H is defined at a border of the planar part and the bent part, and a case in which the hook opening part SC-H is defined spaced apart by a predetermined distance, for example, a height corresponding to the thickness of the shield cover SC from the border.

In an exemplary embodiment, the hook opening part SC-H may be a space defined to pass through the planar part, and one surface defining the space, in which the hook opening part SC-H is provided, may correspond to the upper surface of the bent part, for example. Accordingly, the hook opening part SC-H may be provided on the planar part SC-P of the shield cover SC while having one surface where the planar part SC-P and the bent part SC-B meet.

The top cover TC may have a plurality of hook parts TC-E. The plurality of hook parts may be arranged in the first direction DR1 which is the direction of the long sides of the display panel.

The plurality of hook parts TC-E provided on the top cover TC may be respectively inserted into the corresponding plurality of hook opening parts SC-H defined in the shield cover SC to be fixed. Here, the hook parts TC-E may apply a pressure to the shield cover SC such that the shield cover SC may be fixed to the bottom cover BC and the top cover TC. Accordingly, the display apparatus according to an exemplary embodiment may include the top cover TC having the hook part, and thus the top cover TC and the shield cover SC disposed under the bottom cover BC may closely contact each other effectively. Accordingly, the display apparatus in which the top cover TC, the bottom cover BC, and the shield cover SC are coupled may maintain a uniform thickness in its entirety.

In particular, even when the curvatures of the top cover TC, the bottom cover BC, and the shield cover SC are not completely the same in the display apparatus having the curved surface, the hook part of the top cover TC may effectively fix the shield cover SC. Accordingly, since the top cover TC and the shield cover SC may be coupled without a lifted portion even in a curved portion, the display apparatus having the curved shape may also maintain a uniform thickness thereof regardless of positions.

FIGS. 4A to 4C are views illustrating a relation between a top cover TC and a shield cover SC. FIG. 4C is a bottom side view illustrating a state in which a top cover TC and a shield cover SC are coupled. In FIGS. 4A and 4B, other components included in a display apparatus are omitted in order to illustrate a coupling shape of a top cover TC and a shield cover SC.

Referring to FIGS. 4A to 4C, a plurality of hook parts TC-E of a top cover TC may be respectively disposed corresponding to a plurality of hook opening parts SC-H which are defined in a planar part of a shield cover SC. The plurality of hook parts TC-E may be inserted into the plurality of hook opening parts SC-H to allow the top cover TC and shield cover SC to be fixedly coupled to each other.

Figure 5:
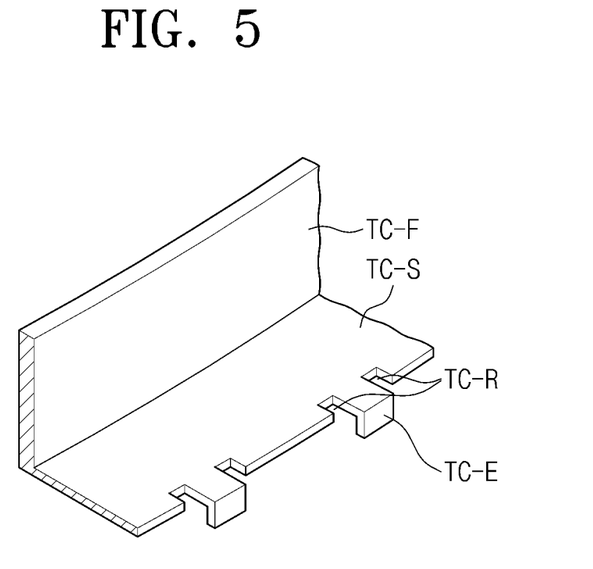
FIG. 5 is a partial perspective view of an exemplary embodiment of a top cover included in a display apparatus according to the invention.

FIG. 5 is an enlarged perspective view illustrating another shape of a top cover TC. The top cover TC includes a side surface part TC-S and a hook part TC-E, and a plurality of recess parts TC-R may be defined in the side surface part TC-S. Each of the plurality of recess parts TC-R may be defined at both sides of the hook part TC-E. The recess parts TC-R defined in the side surface part TC-S of the top cover TC may allow the hook part TC-E to be easily inserted into a coupling region when coupled corresponding to the hook opening part SC-H.

Figure 6A:
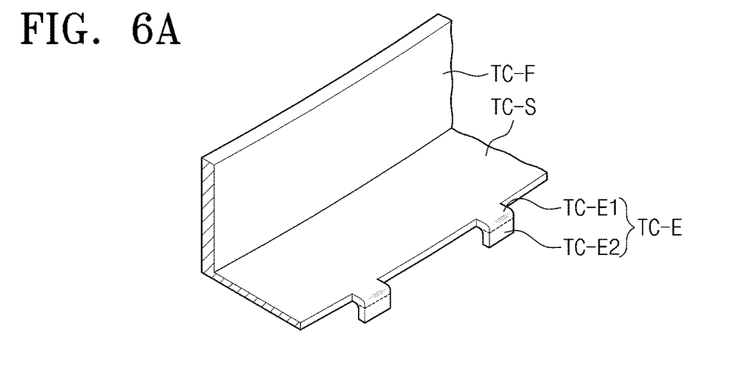
FIGS. 6A to 6C are partial perspective views of an exemplary embodiment of a top cover included in a display apparatus according to the invention.
Figure 6B:
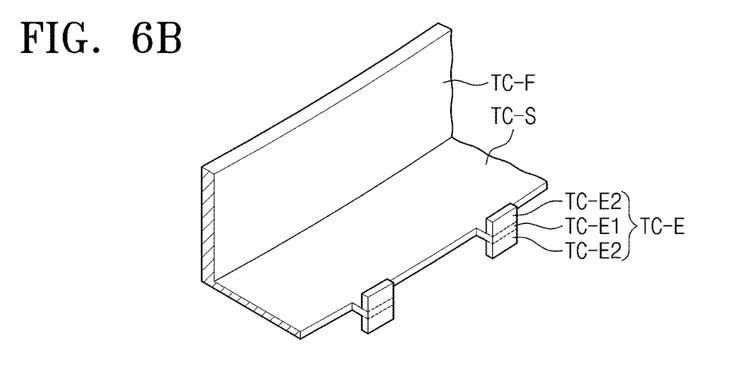
Figure 6C:
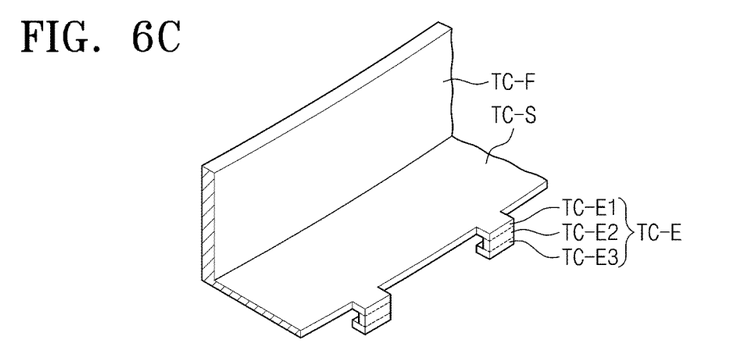

FIGS. 6A to 6C are views illustrating shapes of a hook part TC-E provided on one end of a top cover TC. In the hook part of FIG. 6A, a first hook portion TC-E1 may be connected to a second hook portion TC-E2 while having a curved surface. That is, the first hook portion TC-E1 may be a portion connected to a side surface part, and the second hook portion TC-E2 may be a bent and protruding portion. Accordingly, the first hook portion TC-E1 disposed between the side surface part TC-S and the second hook portion TC-E2 may have a curved surface.

In FIG. 6B, a hook part extends from a side surface part and being bent, but unlike the exemplary embodiment in FIG. 2B, the second hook portion TC-E2 may be provided to include a region extending in an outward direction of a planar part and also a region extending to face the planar part.

In FIG. 6C, a hook part may further include a third hook portion TC-E3 which extends from a second hook portion TC-E2, is bent from the second hook portion, and faces a bent part SC-B of the shield cover SC when assembled to a display apparatus.

Figure 7:
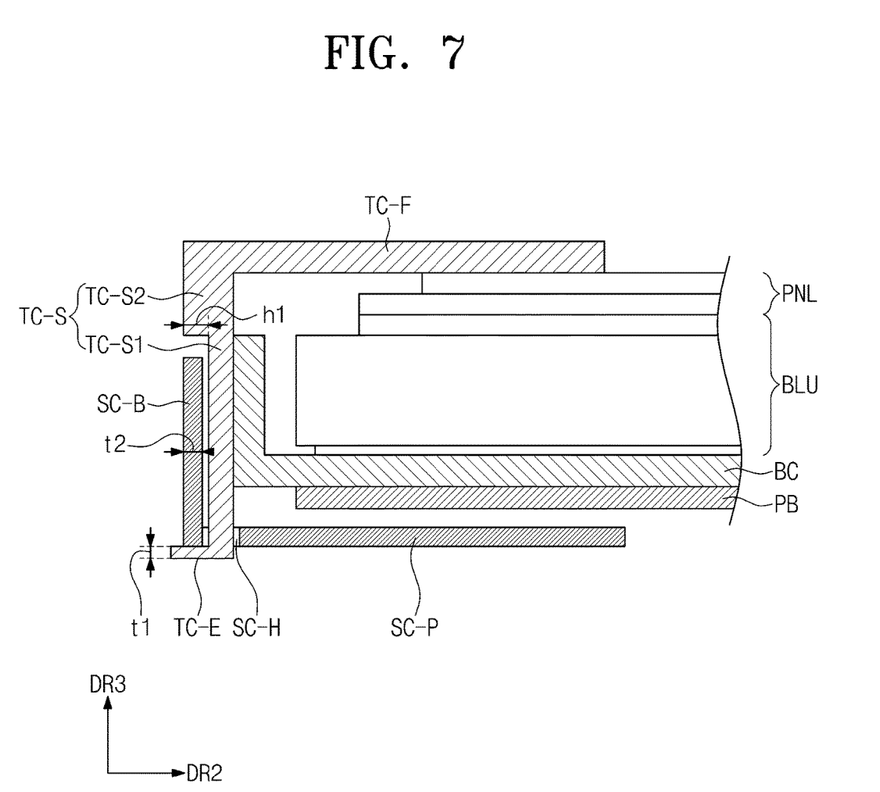
FIG. 7 is a partial cross-sectional view of an exemplary embodiment of a display apparatus according to the invention.

FIG. 7 is a view illustrating a cross-section of one portion of a display apparatus 100. In an exemplary embodiment, a top cover TC may include a front surface part TC-F, a side surface part TC-S, and a hook part TC-E. Also, the side surface part TC-S of the top cover TC may be disposed such that at least one portion thereof face a bent part SC-B of a shield cover SC (refer to FIGS. 1 and 3).

In particular, the side surface part TC-S may be provided to include a first portion TC-S1 facing the bent part SC-B of the shield cover SC, and a second portion TC-S2 provided to have a step from the first portion TC-S1.

Also, the second portion TC-S2 may be thicker than the first portion TC-S1.

When the height of the step between the first and second portions TC-S1 and TC-S2 may be h1, and the thickness of the bent part SC-B is t2, h1 may be equal to or greater than t2. That is, the bent part SC-B of a shield cover SC may be disposed corresponding to the step region provided on the side surface part TC-S of the top cover TC.

The hook part TC-E of the top cover TC (refer to FIGS. 1, 2A and 2B) may protrude from a planar part SC-P of the shield cover SC which is disposed on a bottom surface of the display apparatus, that is, on a bottom surface of a bottom part of a bottom cover BC. Referring to FIG. 7, the planar part SC-P of the shield cover SC and the hook part TC-E are not coplanar, and the hook part TC-E may be disposed protruding from the planar part SC-P of the shield cover SC by at least the thickness t1 of the hook part.

In an exemplary embodiment, the hook part provided on the top cover TC may be inserted into a hook opening part SC-H defined in a shield cover SC and fixed, and the hook part may apply a pressure to the shield cover SC such that the shield cover SC may be fixed. Accordingly, the hook part inserted into the hook opening part SC-H may fix the shield cover SC such that the shield cover SC is not lifted in a direction toward the top cover TC and closely contact the top cover TC. In particular, in a curved display apparatus, even when the top cover TC, the bottom cover BC, and the shield cover SC have minute curvature differences, the hook part of the top cover TC is inserted into the hook opening part SC-H of the shield cover SC and fix the shield cover SC. Thus, the thickness of the display apparatus may be uniformly maintained in its entirety without a lifting phenomenon of the shield cover SC.

Figure 8A:
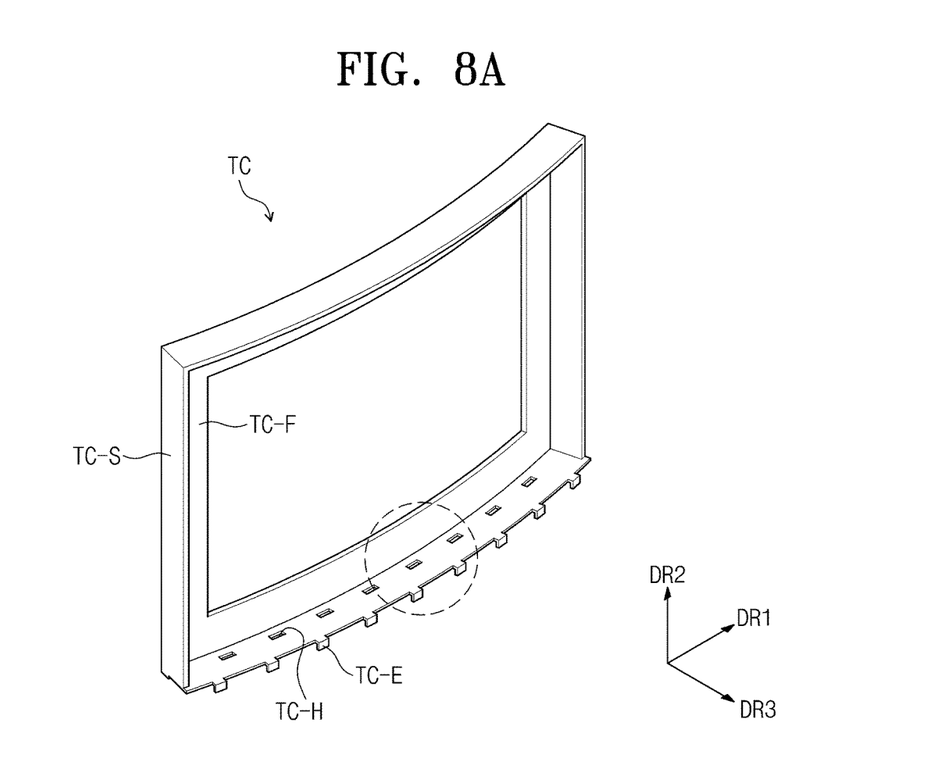
FIGS. 8A and 8B are perspective views of an exemplary embodiment of a top cover included in a display apparatus according to the invention.
Figure 8B:
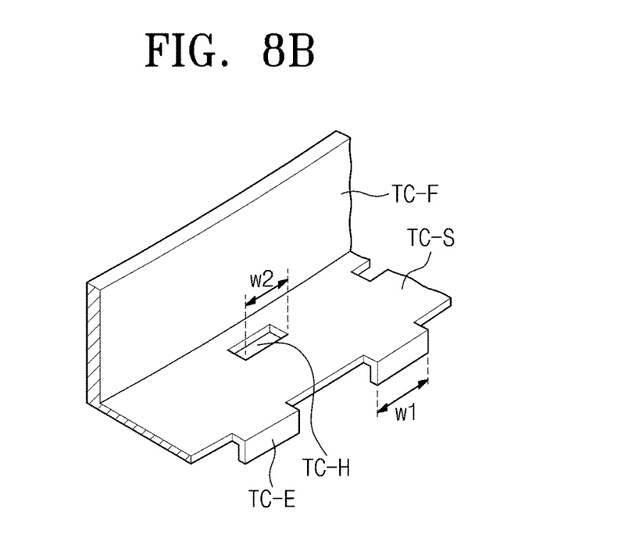

FIGS. 8A and 8B are views illustrating another embodiment of a top cover TC. FIG. 8A is a perspective view of the top cover TC, and FIG. 8B is an enlarged partial perspective view illustrating the portion indicated with a dotted line in FIG. 8A.

In an exemplary embodiment, the top cover TC may further include a coupling opening part TC-H defined in a side surface part TC-S. Referring to FIGS. 8A to 8B, in an exemplary embodiment, the top cover TC may include a plurality of hook parts TC-E and a plurality of coupling openings TC-H which are defined in a side surface part TC-S. The plurality of hook parts TC-E and the plurality of coupling openings TC-H may be arranged and disposed in a first direction DR1 which is the direction of the long sides of a display apparatus.

The same number of plurality of hook parts TC-E and plurality of coupling openings TC-H may be provided on the side surface part of the top cover TC, but the exemplary embodiment of the invention is not limited thereto. In an exemplary embodiment, a larger number of hook parts TC-E than that of the coupling openings TC-H may be provided.

The width w1 of the hook parts TC-E in the first direction DR1 may be greater than the width w2 of the coupling opening TC-H in the first direction DR1. That is, the hook parts may correspond to protruding parts having greater widths than the coupling parts of the shield cover SC which are inserted into and fixed to the coupling opening part.

The shield cover SC may be more stably coupled and fixed to the top cover TC by allowing the width of the hook part to be greater than that of the coupling part of the shield cover SC.

This is because the shield cover SC may be provided to have a thickness smaller than that of the top cover TC, and the shield cover SC may include a material having flexibility.

Also, the plurality of hook parts TC-E and the plurality of coupling opening parts TC-H may be alternately disposed in the first direction DR1. The number of disposed hook parts TC-E and coupling opening parts TC-H are not limited to that illustrated in the drawing, and may be changed according to the size of the curvature, the size of the display apparatus, or the like.

Figure 9:
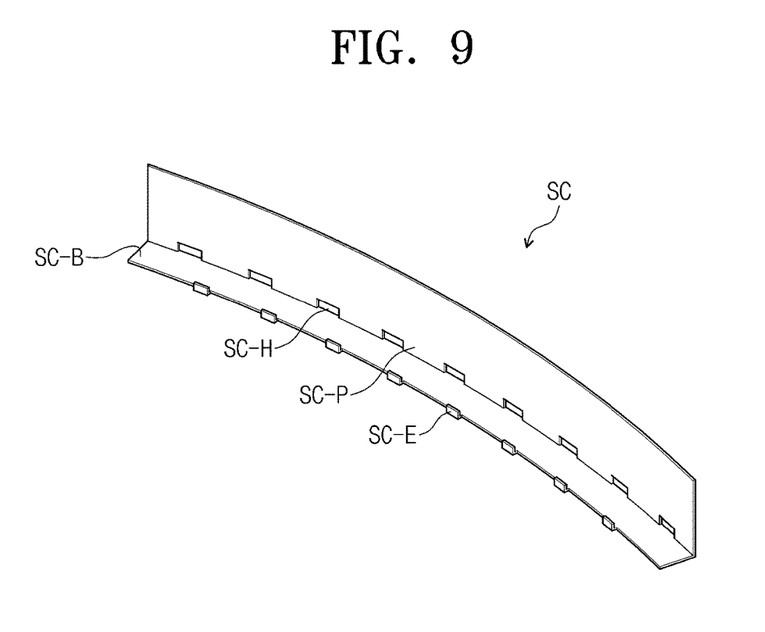
FIG. 9 is a perspective view of an exemplary embodiment of a shield cover included in a display apparatus according to the invention.

FIG. 9 is a view illustrating another embodiment of a shield cover SC. The shield cover SC may include a planar part SC-P and a bent part SC-B bent from the planar part, and the planar part may include a hook opening part SC-H. Also, a coupling part SC-E, which is provided to be bent from the bent part to face the planar part, may be further included The coupling part SC-E of the shield cover SC may be provided on a position corresponding to a coupling opening part TC-H provided in the above-mentioned top cover TC of FIGS. 8A to 8B. The coupling part SC-E may be inserted into and fixed to the coupling opening part TC-H, and thus may couple the shield cover SC and the top cover TC to each other.

The shield cover SC may include a plurality of hook opening part SC-H arranged and disposed in the first direction DR1, and a plurality of coupling parts SC-E. The plurality of hook opening parts SC-H and the plurality of coupling parts SC-E may be alternately disposed in the first direction DR1 which is the direction of long sides of the display panel.

Figure 10A:
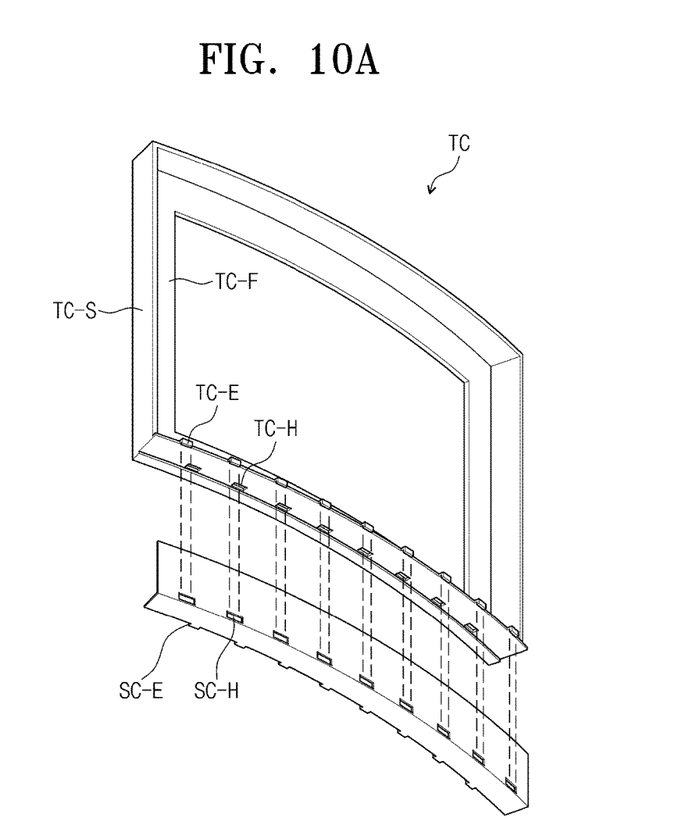
FIGS. 10A to 10B are views illustrating an exemplary embodiment of a coupling relation between a shield cover and a top cover included in a display apparatus according to the invention.
Figure 10B:
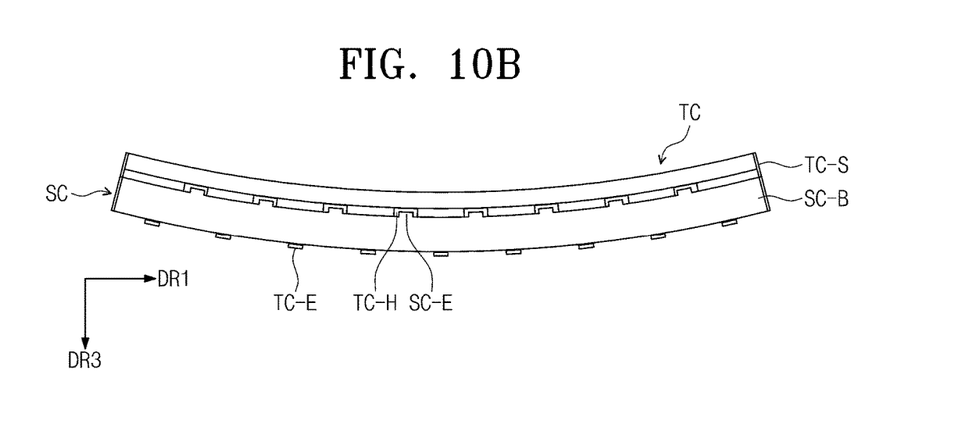

FIGS. 10A to 10B are a coupling perspective view illustrating a coupling relation between the top cover TC illustrated in FIG. 8A and the shield cover SC illustrated in FIG. 9. A display apparatus, in coupling of the shield cover SC and the top cover TC, may solve a lifting phenomenon which may occur in fixing the shield cover SC to the display apparatus in such a way that a hook part TC-E provided on the top cover TC is coupled to the corresponding hook opening part SC-H of the shield cover SC, and a coupling part SC-E of the shield cover SC is coupled to the corresponding coupling opening part TC-H of the top cover TC.

Accordingly, the thickness of the display apparatus in its entirety may be uniformly managed by using the hook part and the coupling opening part which are defined in the top cover TC, and the hook opening part SC-H and the coupling part which are respectively coupled thereto corresponding thereto. In particular, in case of a display apparatus having a curved surface, even when the curvatures of a top cover TC, a bottom cover BC, and a shield cover SC are not the same, the top cover TC and the shield cover SC may be effectively coupled without a lifting phenomenon.

Figure 11:
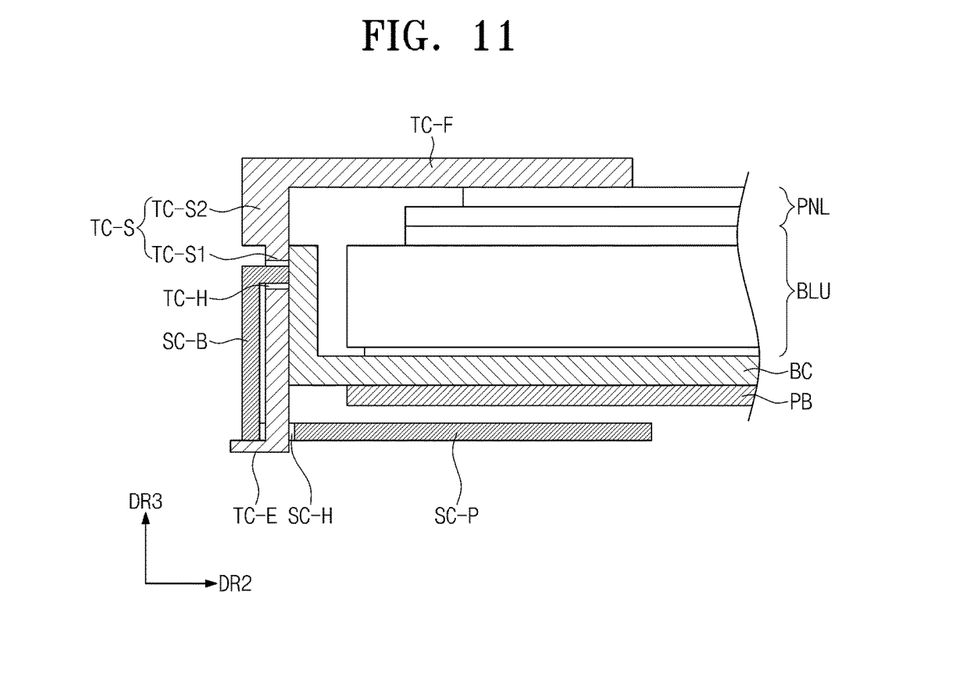
FIG. 11 is a partial cross-sectional view of an exemplary embodiment of a display apparatus according to the invention.

FIG. 11 is a partial cross-sectional view of a portion of a display apparatus according to an exemplary embodiment. FIG. 11 illustrates a cross-section of a portion at which a coupling opening part TC-H defined in a top cover TC and a coupling part SC-E provided on a shield cover SC are inserted and coupled. The coupling part SC-E of the shield cover SC may face a planar part SC-P of the shield cover SC by being bent from a bent part SC-B.

The bent part SC-B of the shield cover SC may be disposed partially facing the side surface part TC-S of the top cover TC. The side surface part TC-S of the top cover TC and the bent part SC-B of the shield cover SC may be overlapped on a side wall part of a bottom cover BC.

Figure 12:
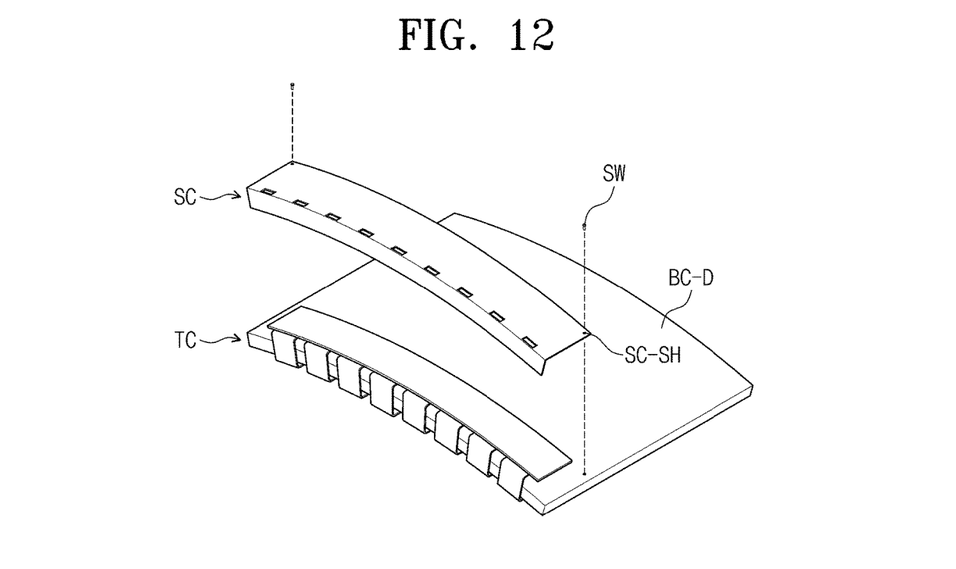
FIG. 12 is a view illustrating an exemplary embodiment of a coupling relation between a bottom cover and a shield cover included in a display apparatus according to the invention.

FIG. 12 is a view illustrating the coupling of a bottom cover BC and a shield cover SC. The shield cover SC may further include screw holes SC-SH. The screw holes SC-SH may be defined in a planar part SC-P of the shield cover SC. Also, screws SW, which are inserted into the screw holes SC-SH and fastens the shield cover SC and the bottom cover BC, may be further included. The shield cover SC may be fixed to the bottom cover BC by the screws SW, and the shield cover SC is coupled and fixed to a display apparatus in a portion which is not coupled to a top cover TC.

The display apparatus in the above-mentioned one embodiment includes the hook part and the coupling part at an end of the side surface part of the top cover, and respectively corresponding to the hook part and the coupling part, the hook opening part and the coupling part are provided by the shield cover. Thus, the top cover and the shield cover may be coupled and fixed to each other. Accordingly, the thickness of the display apparatus in its entirety may be uniformly managed by coupling and fixing the shield cover to the top cover. In particular, in case of a display apparatus having a curved surface, even when the curvatures of a top cover, a bottom cover, and a shield cover, which are structures constituting the display apparatus, are not the same, the top cover and the shield cover may be effectively coupled without a lifting phenomenon.

A display apparatus according to an exemplary embodiment includes a hook part, which is fastened to a shield cover, on a top cover, and thus allows the thickness thereof to be uniformly maintained in an assembled state.

Also, in a curved display apparatus having a curvature, even when there are minute differences in curvatures between each of the coupled structures, a lifting phenomenon may be prevented, and thus the display apparatus may have an improved appearance quality.

It will be apparent to those skilled in the art that various modifications and variations can be made in the invention. Thus, it is intended that the invention covers the modifications and variations of this invention provided they come within the scope of the appended claims and their equivalents.

Therefore, the scope of the invention is defined not by the detailed description of the invention but by the appended claims.

What is claimed is:

1. A display apparatus comprising:
   a display panel;
   a bottom cover which accommodates the display panel, and includes a bottom part and a side wall part bent in a direction substantially perpendicular to a plane in which the bottom part extends;
   a printed circuit board electrically connected to the display panel, and disposed on a lower surface of the bottom part;
   a shield cover disposed on a lower surface of the printed circuit board, and including a planar part on which a hook opening part is defined, and a bent part bent from the planar part to face the side wall part, and
   a top cover which is coupled to the bottom cover and includes:
      a side surface part which surrounds the side wall part, and
      a hook part extending from one end of the side surface part, inserted into the hook opening part, and coupled to the shield cover,
   wherein the side surface part is disposed between the side wall part and the bent part.

2. The display apparatus of claim 1, wherein
   the display panel includes a curved surface, and
   each of the bottom cover, the top cover and the shield cover has a shape curved along the curved surface.

3. The display apparatus of claim 2, wherein the hook part has a shape curved along the curved surface.

4. The display apparatus of claim 1, wherein the hook opening part is disposed adjacent to a border line between the planar part and the bent part.

5. The display apparatus of claim 1, wherein the hook part comprises:
   a first hook portion connected to the side wall part to pass through the hook opening part; and
   a second hook portion bent in an outward direction of the planar part from the first hook portion,
   wherein the first hook portion has a curved surface.

6. The display apparatus of claim 5, wherein the hook part further comprises a third hook portion bent from the second hook portion to face the bent part.

7. The display apparatus of claim 1, wherein a plurality of recess parts is defined in the top cover, and
   wherein the plurality of recess parts is provided respectively at both sides of the hook part.

8. The display apparatus of claim 1, wherein the top cover further comprises a front surface part which is bent from the other end facing the one end of the side surface part, and which partially covers an upper surface of the display panel.

9. The display apparatus of claim 1, wherein
   the hook opening part is defined in the planar part in plurality, the plurality of hook opening parts are arranged in a direction of long sides of the display panel, the hook part is provided in plurality, and
   the plurality of hook parts are respectively disposed corresponding to the plurality of hook opening parts.

10. The display apparatus of claim 1, wherein the side surface part faces at least a portion of the bent part.

11. The display apparatus of claim 10, wherein the side surface part comprises:
    a first portion which faces the bent part; and
    a second portion which provides a step with respect to the first portion.

12. The display apparatus of claim 11, wherein a thickness of the second portion is equal to or greater than a thickness of the first portion.

13. The display apparatus of claim 1, wherein a coupling opening part is defined in the side surface part of the top cover.

14. The display apparatus of claim 13, wherein the shield cover further comprises a coupling part bent from the bent part to face the planar part,
    wherein the coupling part is inserted into the coupling opening part.

15. The display apparatus of claim 13, wherein
    the coupling opening part is defined in the side surface part in plurality, the hook part is provided in plurality, and
    the plurality of coupling opening parts and the plurality of hook parts are alternately disposed along the direction of long sides of the display panel.

16. The display apparatus of claim 1, wherein screw holes are defined in the planar part of the shield cover, and
    the shield cover further comprises screws which are inserted into the screw holes and which fasten the shield cover and the bottom cover.

* * * * *